United States Patent [19]

Mueller et al.

[11] 3,933,530

[45] Jan. 20, 1976

[54] METHOD OF RADIATION HARDENING AND GETTERING SEMICONDUCTOR DEVICES

[75] Inventors: Charles William Mueller, Princeton; Edward Curtis Douglas, Princeton Junction; Chung Pao Wu, Trenton, all of N.J.

[73] Assignee: RCA Corporation, New York, N.Y.

[22] Filed: Jan. 28, 1975

[21] Appl. No.: 544,702

[52] U.S. Cl............................ 148/1.5; 357/91
[51] Int. Cl.$^2$........................................ H01L 21/265
[58] Field of Search..................... 148/1.5; 357/91

[56] References Cited
UNITED STATES PATENTS

| | | | |
|---|---|---|---|
| 3,556,878 | 1/1971 | Ginsbach et al. | 148/175 |
| 3,570,112 | 3/1971 | Barry et al. | 148/1.5 X |
| 3,799,813 | 3/1974 | Danchenko | 148/1.5 |

OTHER PUBLICATIONS

Perkins et al., "Radiation Effects in Modified oxide Insulators–etc., " IEEE Trans. Nucl. Sci., NS–15, 17b, (1968).
Donovan et al. "Radiation Hardening of Thermal Oxides on Silicon–Etc., " J. Appl. Phys., Vol. 43, No. 6, June'72, pp. 2897–2899.
Green et al., "Method to Purify Semiconductor Wafers," IBM Tech. Discl. Bull., Vol. 16, No. 5, Oct. 73, pp. 1612–1613.

Primary Examiner—L. Dewayne Rutledge
Assistant Examiner—J. M. Davis
Attorney, Agent, or Firm—H. Christoffersen; R. P. Williams

[57] ABSTRACT

In one embodiment, a semiconductor device, such as an insulated-gate-field-effect-transistor (IGFET), is simultaneously radiation hardened with Al ions and its threshold voltage stabilized with halide ions, such as Cl ions, by bombarding a silicon dioxide gate insulator of the device with molecular ions of an aluminum halide, such as $AlCl_2^+$ ions. In another embodiment, a surface (target) of silicon is bombarded with molecular $AlCl_2^+$ ions to ion implant separate Al ions and Cl ions. There, an oxide layer subsequently thermally grown on the bombarded surface includes the Al ions and the Cl ions, and the oxide layer is radiation hardened and gettered.

7 Claims, No Drawings

METHOD OF RADIATION HARDENING AND GETTERING SEMICONDUCTOR DEVICES

This invention relates to a method of radiation hardening and gettering a layer of silicon dioxide by ion implantation. The novel method is particularly useful for implanting impurity atoms in relatively thin layers of material in the manufacture of semiconductor devices.

It has been known that certain insulated-gate-field effect-transistors (IGFETs), such as metal-oxide-semiconductor (MOS) transistors, having silicon dioxide gate insulators, for example, become degraded in time due to the effects of radiation, as from space, on the gate insulator. Since the gate insulator (oxide) is usually relatively thin, ranging in thickness usually between about 800A and 1200A, changes in the electrical characteristics of these transistors are quite marked when radiation damage occurs.

It has been proposed to decrease the effects of radiation damage in an MOS device by implanting aluminum (Al) ions into the gate oxide. The ion implantation of Al ions into only the gate oxide, without doping the semiconductor material underneath it, however, is difficult to control because the gate oxide is relatively very thin. According to calculations, for example, a low ion-accelerating voltage of about 15 KeV or less should be used in order not to dope the semiconductor material (usually silicon) below the gate oxide with the implanted Al ions. These low ion-accelerating voltages, however, are usually below the normal operating range of most ion-implanting machines in common use. Also, at these low ion-accelerating voltages, the Al ion current that can be obtained is relatively very small, being in the nanoampere range, and, consequently, excessively long (about 1000 hrs.) implants are necessary to secure the high doping concentration that is usually necessary. In accordance with the novel method of the present invention, the necessity of operating ion-implantation machines at relatively low voltages where they are inefficient and difficult to control is obviated.

It has been known that insulated-gate-field-effect-transistors of the MOS type, employing silicon dioxide as a gate insulator, for example, exhibit an unstable threshold voltage if there are mobile impurity ions such as alkali (i.e. Li, Na, K) ions, in the gate (insulator) oxide. It has been proposed to getter these mobile ions by introducing chlorine (Cl) atoms into the gate oxide. The ion implantation of chlorine atoms into a thin (about 1000A thick) gate oxide, however, present the same difficulties described for the implantation of aluminum atoms into the gate oxide. Because the gate oxide is relatively thin and the ion-accelerating voltage for the chlorine ions should be relatively low to prevent penetration through the gate oxide, it is substantially impractical to ion implant the chlorine ions by conventional, prior-art, ion-implantation methods.

Briefly, the novel method makes use of operations for limiting the penetration of ions into a material. Consequently, molecular ions of molecularly-bound different atoms, that include the desired atoms to be implanted, are produced and accelerated in ion-implantation apparatus. The kinetic energy of the accelerated molecular ions is greater than the molecular binding energy of the molecular ions. The molecular ions are caused to impact with the material (target), whereby the different atoms of the molecular ions break away from each other, and each atom assumes a reduced ion-implantation energy that is substantially parallel to the ratio of its mass to the mass of the molecular ion.

In one embodiment of the novel method, both aluminum ions and halide ions are implanted in a single ion-implantation operation, into the gate oxide of an IGFET (during its manufacture) to harden and getter it. (Molecular) aluminum halide ions, such as molecular $AlCl_2^+$ ions, are accelerated toward the exposed gate oxide with a kinetic energy that is greater than the molecular binding energy of the atoms in the molecular aluminum halide ions. Upon the impact of the molecular aluminum halide ions with the gate oxide, each molecular ion breaks up into one aluminum ion and two halide ions; and each of the aluminum ions and halide ions assumes a reduced ion-implantation energy substantially proportional to the ratio of its mass to the mass of the molecular aluminum halide ion.

In another embodiment of the novel method, molecular aluminum halide ions are accelerated toward the surface of a silicon body for collision therewith in the manner described above. An oxide (silicon dioxide) layer is then grown thermally on the surface of the silicon body. The oxide layer subsequently contains both Al atoms and halide atoms for radiation hardening and gettering purposes.

Two basically different ion sources are generally used in ion implantation machines. One ion source utilizes an rf oscillator (about 100 MHz, 200 watts) to drive a plasma in a tube filled with a gas which contains the desired atomic species. Gas is fed into the plasma tube through a thermomechanical leak device. High vapor pressure materials (e.g. $BF_3$ or $BCl_3$) are obtained in lecture bottles and are fed to the thermomechanical leak device through a pressure reducer. Low vapor pressure fluid materials (e.g. $PCl_3$ or $AsCl_3$) are placed in a stainless steel canister and the line pressurized to the vapor of the fluid. If necessary, heater tape can be used to elevate the fluid temperature to increase the supply pressure to the thermomechanical leak device. Certain solid materials containing the desired atom species can also be used with the rf oscillator by placing the material directly in the plasma tube and using hydrogen or helium as the plasma gas. Hydrogen ions in the plasma bombarding the solid material can create the desired ions.

Ions can also be obtained from solid materials (e.g. aluminum halides) by using a hot cathode source. In the latter case, the solid material is first pulverized and then placed in a heated chamber. Vapors leaving the chamber are ionized by causing them to pass through an electron stream.

Ions produced either in the rf oscillator or by the hot cathode source are accelerated to a desired energy in an accelerating column of the ion implantation machine and caused to collide with a target, the material into which ions are to be implanted.

The novel method of achieving shallow ion implants of desired atoms into a material employs a relatively heavy molecular ion which includes the desired implant atoms among its chemical elements. The relatively heavy molecular ion is initially accelerated to an energy in the efficient region of ion-implanting machine operation. The molecular ion breaks up readily on impact with a target because the molecular binding energy of the atoms of the molecular ion is relatively much smaller (about 1/30,000) than the kinetic energy of the accelerated molecular ion.

The novel method, except for the very small perturbation due to the molecular binding energy, is physically equivalent to the case in which the target material is simultaneously bombarded with the constituent atoms whose impinging velocities are the same as that of the accelerated molecular ions. We thus have, $$E_I = \frac{V_I^2}{2} \sum_j m_j,$$

or $$\frac{V_I^2}{2} = E_I / \sum_j m_j$$

where $E_I$ and $V_I$ are the initial energy and the velocity respectively, of the molecular ion, and $m_j$ denotes the masses of the different atoms in the molecular ion. This energy $E_I$ is partitioned among the constituent atoms (chemical elements of the molecular ion) such that after the impact, the energy in the kth atoms is given by $E_k = \frac{1}{2} m_k V_I^2 = E_I m_k / \Sigma_j m_j$.

For example, the junction depth of an Al ion to be expected from a molecular $AlCl_2^+$ ion impinging on a silicon wafer at about 70 KeV would be roughly the same as the junction depth to be expected from about a 20 KeV Al ion implant (i.e. 70 [mol. wt. Al/mol. wt. $AlCl_2$]). The accompanying Cl ions simultaneously implanted into the silicon wafer are inert, in most semiconductor applications, as far as doping the silicon is concerned.

In one embodiment of the novel method, molecular $AlCl_2^+$ ions were accelerated in an ion-implantation machine at 40 KeV and caused to impinge upon a relatively thin (about 1000A) silicon dioxide layer on a silicon substrate. Most of the Al atoms entered the silicon dioxide layer, and only a negligible amount of Al atoms penetrated the layer into the silicon substrate. This high-dose, small-penetration implant would not have been possible and/or practical by accelerating only aluminum ions in a conventional ion-implantation machine, such as, for example, a 300 KeV machine commercially available from Accelerators Inc., Austin, Texas.

In practice, molecular aluminum halide ions, such as molecular $AlCl_2^+$ ions are obtained by heating solid $AlCl_3$ in a quartz tube inserted in a hot-filament ion source. The $AlCl_3$ is vaporized and the gaseous vapor is ionized by electron collisions occurring as the electrons move in a helical path, caused by the electric field of the ion source and the magnetic field of the ion-implantation apparatus. Useful numbers of ions of Al, AlCl, and $AlCl_2$ are produced. Typical values of ion current are as follows:

Al 8μA at 69 KeV
AlCl 2μA at 69 KeV
$AlCl_2$ 15μA at 69 KeV

Other aluminum halides, such as $AlF_3$, $AlBr_3$, and $AlI_3$, for example, can be treated in the same manner described for $AlCl_3$ to provide Al ions and halide ions suitable for radiation hardening and gettering an oxide layer of silicon.

Magnetic means are incorporated in conventional ion-implanting machines to isolate and focus selected ions, such, as for example, molecular $AlCl_2^+$ ions. An $AlCl_2^+$ ion current of 15 μA at 69 KeV requires about 43 minutes to ion implant a dose of $10^{15}$ Al ions into a layer of silicon dioxide having a thickness of about 1000A. In order to implant this same Al ion dose utilizing only an Al ion current in a conventional ion-implantation machine, a current of 10 nA Al ions accelerated below 15 KeV would be used, and it would require 1075 hours. This, no doubt, is an excessively long and, therefore, impractical time.

The halide, Cl ions, implanted into a silicon dioxide layer at the same time as the Al ions, function as a getter to tie up the mobile (alkali elements) impurities in the silicon dioxide layer. Thus, the implanted Cl ions reduce undesired drifts (instability) of the threshold gate voltage of an IGFET. Halide ions, such as F ions, Br ions, and I ions, derived from molecular ions of $AlF_2^+$ $AlBr_2^+$, and $AlI_2$, respectively, also provide a gettering effect in a layer of silicon dioxide.

In another embodiment of the novel method, means are provided to grow an oxide layer, on the surface of a semiconductor material, that is radiation hardened and has gettering for mobile ions that may cause instability in a device made with the oxide layer. In this embodiment, molecular aluminum halide ions, such as molecular $AlCl_2^+$ ions, for example, are accelerated toward the surface of a body of silicon and caused to collide therewith under conditions substantially similar to the aforementioned embodiment of the novel method. In impinging upon the surface of the silicon body, Al ions and Cl ions are implanted in a shallow layer adjacent to the surface of the silicon body. When the surface of the silicon body is subsequently thermally oxidized, for example, as by heating the silicon body in steam at a temperature of about 1200°C for about 15 minutes, a layer of silicon dioxide is formed that contains both the Al ions and Cl ions. If molecular ions of $AlF_2^+$, $AlBr_2^+$, or $AlI_2^+$ are used, instead of the molecular $AlCl_2^+$ ions, in the above example, the respective resulting halide ions also function as gettering agents. The Cl ion, however, is the preferred halide ion for this purpose. Thus, the thermally grown silicon dioxide layer is radiation hardened and provided with halide ions for gettering impurity ions that may cause instability in devices subsequently made with the silicon dioxide layer and the silicon body.

In the foregoing methods an annealing operation is necessary to remove damage caused by the ion bombardment of the ion-implantation operation. For example, heating the ion-implanted layer at a temperature of between 600°C and 1100°C for between 5 and 20 minutes is a suitable annealing operation for most applications.

Thus, in accordance with the novel method of ion implantation, means are provided to simultaneously implant at least two atoms, from a molecular ion, with a more limited penetration for each atom than is possible if each individual atom had the same kinetic energy as that the molecular ion from which it is derived. Each ion implanted by the novel method is done with only a fraction of the kinetic energy of the molecular ion from which it originated. Hence, the novel method makes it possible to utilize commercially available ion-implantation machines to achieve relatively shallow and simultaneous implants that would be relatively difficult, and in some cases impossible, if the individual ions were to be accelerated, and implanted separately. The novel method provides the simultaneous advantages of radiation hardening silicon dioxide with aluminum ions and of utilizing halide ions as a getter under conditions that greatly shorten the time of implantation.

What is claimed is:

1. A method of radiation hardening and gettering a layer of silicon dioxide formed on a body of semiconductor material during the manufacture of a semiconductor device, said method comprising the steps of:
providing a source of molecular aluminum halide ions, and
accelerating said molecular aluminum halide ions towards said body, on an impact course, with a kinetic energy that is greater than the molecular binding energy of said molecular aluminum halide ions so that each of said molecular aluminum halide ions breaks up into Al ions and halide ions upon impact, whereby each of said Al ions and halide ions assumes an ion-implantation energy substantially proportional to the ratio of its mass to the mass of said molecular aluminum halide ions.

2. A method of radiation hardening and gettering a layer of silicon dioxide as described in claim 1, wherein:
said molecular aluminum halide ions are caused to impact with said layer of silicon dioxide on said body, whereby to implant said ions of Al and halide in said layer.

3. A method of radiation hardening and gettering a layer of silicon dioxide as described in claim 1, wherein:
said molecular aluminum halide ions are caused to impact with a surface of said body of semiconductor material for implantation therein,
said semiconductor material is silicon, and said surface is thereafter thermally oxidized to form said layer of silicon dioxide, whereby said layer contains said ions of Al and halide.

4. A method of radiation hardening and gettering a layer of silicon dioxide as described in claim 1, wherein:
the step of providing a source of molecular aluminum halide ions comprises vaporizing an aluminum halide chosen from the group consisting of aluminum fluoride, aluminum chloride, aluminum bromide, aluminum iodide, and mixtures thereof in a hot-filament ion source.

5. A method of radiation hardening and gettering a layer of silicon dioxide as described in claim 1, wherein:
said semiconductor device is an IGFET, and
said layer of silicon dioxide is a gate dielectric of said IGFET.

6. A method of radiation hardening and gettering a layer of silicon dioxide as described in claim 1, wherein:
said layer of silicon dioxide is annealed after said Al and halide ions are implanted therein.

7. A method of radiation hardening and gettering a layer of silicon dioxide as described in claim 1, wherein:
said molecular aluminum halide ions are derived by vaporizing $AlCl_3$ in a hot filament source to obtain molecular $AlCl_2^+$ ions.

* * * * *